US007670730B2

(12) United States Patent
Streefkerk et al.

(10) Patent No.: US 7,670,730 B2
(45) Date of Patent: Mar. 2, 2010

(54) LITHOGRAPHIC APPARATUS AND DEVICE MANUFACTURING METHOD

(75) Inventors: Bob Streefkerk, Tilburg (NL); Johannes Jacobus Matheus Baselmans, Oirschot (NL); Sjoerd Nicolaas Lambertus Donders, Vught (NL); Jeroen Johannes Sophia Mertens, Knegsel (NL); Johannes Catharinus Hubertus Mulkens, Valkenswaard (NL); Christiaan Alexander Hoogendam, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1061 days.

(21) Appl. No.: 11/298,942

(22) Filed: Dec. 12, 2005

(65) Prior Publication Data
US 2006/0158626 A1    Jul. 20, 2006

Related U.S. Application Data

(63) Continuation-in-part of application No. 11/025,603, filed on Dec. 30, 2004, now abandoned.

(51) Int. Cl.
*G03C 5/00* (2006.01)
*G03F 9/00* (2006.01)
(52) U.S. Cl. .................. 430/30; 430/22; 430/302; 356/400
(58) Field of Classification Search .............. 430/22, 430/30, 302; 356/400
See application file for complete search history.

(56) References Cited

U.S. PATENT DOCUMENTS

| 3,573,975 | A | 4/1971 | Dhaka et al. ............... 117/212 |
|---|---|---|---|
| 3,648,587 | A | 3/1972 | Stevens ........................ 95/44 |
| 4,346,164 | A | 8/1982 | Tabarelli et al. ............. 430/311 |
| 4,390,273 | A | 6/1983 | Loebach et al. ............. 355/125 |
| 4,396,705 | A | 8/1983 | Akeyama et al. ............. 430/326 |
| 4,480,910 | A | 11/1984 | Takanashi et al. ............ 355/30 |
| 4,509,852 | A | 4/1985 | Tabarelli et al. |
| 5,040,020 | A | 8/1991 | Rauschenbach et al. ....... 355/53 |
| 5,121,256 | A | 6/1992 | Corle et al. ................. 359/664 |
| 5,610,683 | A | 3/1997 | Takahashi .................... 355/53 |
| 5,825,043 | A | 10/1998 | Suwa ......................... 250/548 |
| 5,900,354 | A | 5/1999 | Batchelder ................... 430/395 |
| 6,191,429 | B1 | 2/2001 | Suwa ......................... 250/548 |
| 6,236,634 | B1 | 5/2001 | Lee et al. .................... 369/112 |
| 6,600,547 | B2 | 7/2003 | Watson et al. ................. 355/30 |
| 6,603,130 | B1 | 8/2003 | Bisschops et al. .......... 250/492.1 |
| 6,952,253 | B2 | 10/2005 | Lof et al. |
| 7,271,917 | B2 * | 9/2007 | Van Donkelaar et al. .... 356/500 |
| 2002/0020821 | A1 | 2/2002 | Van Santen et al. ......... 250/492 |
| 2002/0163629 | A1 | 11/2002 | Switkes et al. ............... 355/53 |
| 2003/0123040 | A1 | 7/2003 | Almogy ....................... 355/69 |
| 2004/0000627 | A1 | 1/2004 | Schuster .................... 250/201.2 |
| 2004/0075895 | A1 | 4/2004 | Lin ............................. 359/380 |
| 2004/0114117 | A1 | 6/2004 | Bleeker ........................ 355/53 |
| 2004/0136494 | A1 | 7/2004 | Lof et al. ...................... 378/34 |
| 2004/0160582 | A1 | 8/2004 | Lof et al. ...................... 355/30 |
| 2004/0165159 | A1 | 8/2004 | Lof et al. ...................... 355/30 |
| 2004/0207824 | A1 | 10/2004 | Lof et al. ...................... 355/30 |
| 2004/0211920 | A1 | 10/2004 | Derksen et al. ............. 250/492.1 |
| 2004/0239954 | A1 | 12/2004 | Bischoff ..................... 356/635 |
| 2004/0263809 | A1 | 12/2004 | Nakano ........................ 355/30 |
| 2005/0007569 | A1 | 1/2005 | Streefkerk et al. |
| 2005/0018155 | A1 | 1/2005 | Cox et al. ..................... 355/30 |
| 2005/0024609 | A1 | 2/2005 | De Smit et al. ............... 35/18 |
| 2005/0030497 | A1 | 2/2005 | Nakamura ................... 355/30 |
| 2005/0046813 | A1 | 3/2005 | Streefkerk et al. ............ 355/30 |
| 2005/0046934 | A1 | 3/2005 | Ho et al. ...................... 359/380 |
| 2005/0052632 | A1 | 3/2005 | Miyajima ..................... 355/53 |
| 2005/0094116 | A1 | 5/2005 | Flagello et al. ............... 355/53 |
| 2005/0094125 | A1 | 5/2005 | Arai ............................ 355/72 |
| 2005/0122505 | A1 | 6/2005 | Miyajima ..................... 355/72 |
| 2005/0132914 | A1 | 6/2005 | Mulkens et al. ............ 101/463.1 |
| 2005/0134817 | A1 | 6/2005 | Nakamura ................... 355/53 |
| 2005/0140948 | A1 | 6/2005 | Tokita .......................... 355/30 |
| 2005/0146693 | A1 | 7/2005 | Ohsaki ......................... 355/30 |
| 2005/0146694 | A1 | 7/2005 | Tokita .......................... 355/30 |
| 2005/0151942 | A1 | 7/2005 | Kawashima ................. 355/30 |
| 2005/0200815 | A1 | 9/2005 | Akamatsu .................... 353/53 |

(Continued)

FOREIGN PATENT DOCUMENTS

DE        206 607        2/1984

(Continued)

OTHER PUBLICATIONS

Korean Office Action issued for Korean Patent Application No. 10-2005-0133107, dated Dec. 8, 2006.

(Continued)

*Primary Examiner*—Christopher G Young
(74) *Attorney, Agent, or Firm*—Pillsbury Winthrop Shaw Pittman LLP

(57) ABSTRACT

A method for correcting an exposure parameter of an immersion lithographic apparatus is provided. In the method, an exposure parameter is measured using a measuring beam projected through a liquid between the projection system and a substrate table of the immersion lithographic apparatus and offset is determined based on a change of a physical property impacting a measurement made using the measuring beam to at least partly correct the measured exposure parameter. Also, there is provided an apparatus and method to measure a height of an optical element connected to liquid between the projection system and the substrate table in the immersion lithographic apparatus.

19 Claims, 6 Drawing Sheets

U.S. PATENT DOCUMENTS

| | | | |
|---|---|---|---|
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 0 834 773 A2 | 4/1998 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 03-040417 A | 2/1991 |
| JP | 04-305915 | 10/1992 |
| JP | 04-305917 | 10/1992 |
| JP | 06-124873 | 5/1994 |
| JP | 06-163348 A | 6/1994 |
| JP | 07-132262 | 5/1995 |
| JP | 07-220990 | 8/1995 |
| JP | 08-219718 A | 8/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-301825 A | 10/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/107048 A2 | 12/2004 |
| WO | WO 2005/010611 | 2/2005 |
| WO | WO 2005/024517 | 3/2005 |

OTHER PUBLICATIONS

M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9(1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", FUTURE FAB International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
Owen et al., "1/8 μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_3$ coefficient in nonparaxial $\lambda$NA scaling equations for resolution, depth of focus, and immersion lithography, *J. Microlith., Microfab., Microsyst.* 1(1):7-12 (2002).
European Search Report for European Application No. 05257813.5, dated Mar. 21, 2006.
Search Report for European Application No. 05257813.5-222, dated Mar. 21, 2006.
Notice of Reasons for Rejection for Japanese Patent Application No. 2005-376924 dated Sep. 4, 2008.

\* cited by examiner

LITHOGRAPHIC APPARATUS AND DEVICE MANUFACTURING METHOD

This application is a continuation-in-part application of U.S. patent application Ser. No. 11/025,603, filed Dec. 30, 2004, now abandoned the content of which is herein incorporated in its entirety by reference.

FIELD

The invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

It would be advantageous, for example, to provide a method, apparatus and/or computer program product for correcting an exposure parameter of an immersion lithographic apparatus.

According to an aspect of the invention, there is provided a method for correcting an exposure parameter of an immersion lithographic apparatus, the method comprising:

measuring an exposure parameter using a measuring beam projected through a liquid between the projection system and a substrate table of the immersion lithographic apparatus; and determining an offset based on a change of a physical property impacting a measurement made using the measuring beam to at least partly correct the measured exposure parameter.

According to an aspect of the invention, there is provided a lithographic apparatus, comprising:

a support structure configured to hold a patterning device, the patterning device configured to impart a beam of radiation with a pattern in its cross-section;

a substrate table configured to hold a substrate;

a projection system configured to project the patterned beam onto a target portion of the substrate;

a liquid supply system configured to provide liquid to a space between the projection system and the substrate table;

a sensor configured to measure an exposure parameter using a measuring beam projected through the liquid; and a correction system configured to determine an offset based on a change of a physical property impacting a measurement made using the measuring beam to at least partly correct the measured exposure parameter.

According to an aspect of the invention, there is provided a computer program product for correcting an exposure parameter of an immersion lithographic apparatus, comprising:

software code configured to measure an exposure parameter using a measuring beam projected through a liquid between the projection system and a substrate table of the immersion lithographic apparatus; and software code configured to determine an offset based on a change of a physical property impacting a measurement made using the measuring beam to at least partly correct the measured exposure parameter.

According to an aspect of the invention, there is provided a lithographic apparatus, comprising:

a substrate table configured to hold a substrate;

a projection system configured to project a patterned beam onto a target portion of the substrate, the projection system having an optical element;

a liquid supply system configured to provide liquid to a space between the projection system and the substrate table, the optical element configured to be connected to the liquid; and a sensor configured to measure a height of the optical element.

According to an aspect of the invention, there is provided a method of correcting for an imaging error of an immersion lithographic apparatus, comprising:

measuring a height of an optical element of a projection system in the immersion lithographic apparatus, the optical element connected to a liquid between the projection system and a substrate table of the projection system; and at least partly correcting the image error by moving the optical element, moving the substrate table, or both.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
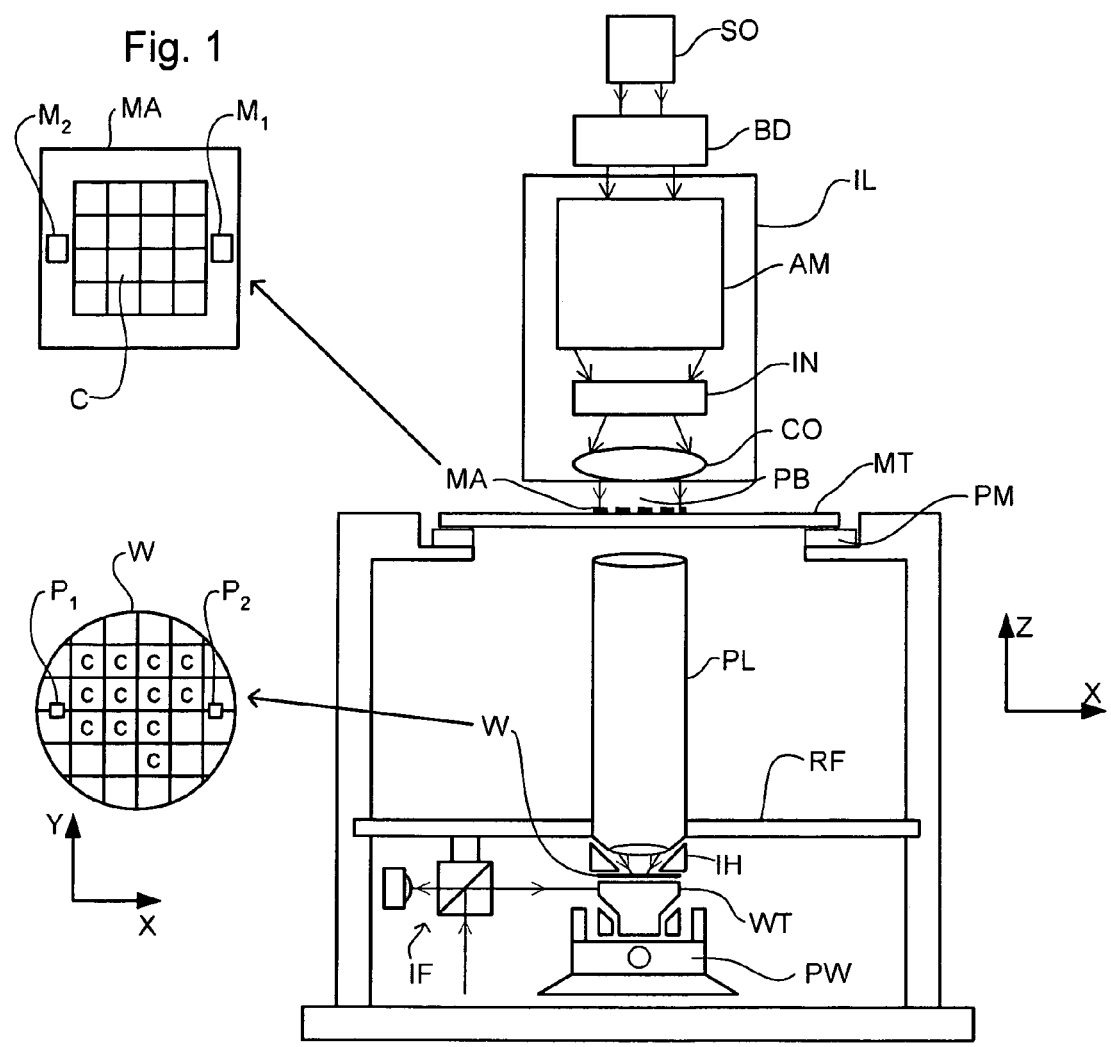
FIG. 1 depicts a lithographic apparatus according to an embodiment of the invention.
Figure 2:
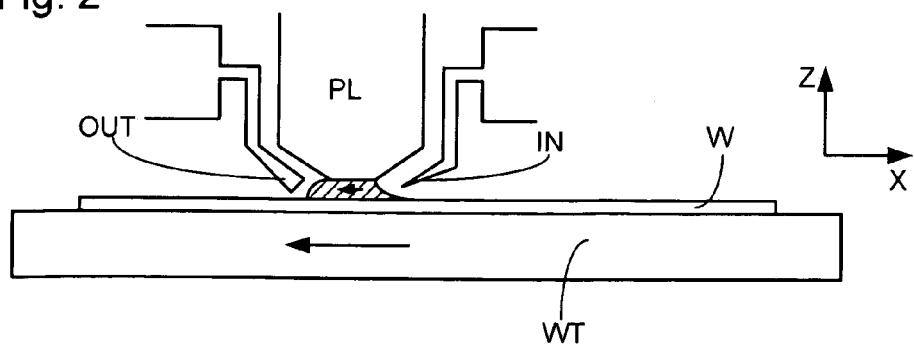
FIGS. 2 and 3 depict a liquid supply system for use in a lithographic projection apparatus.
Figure 3:
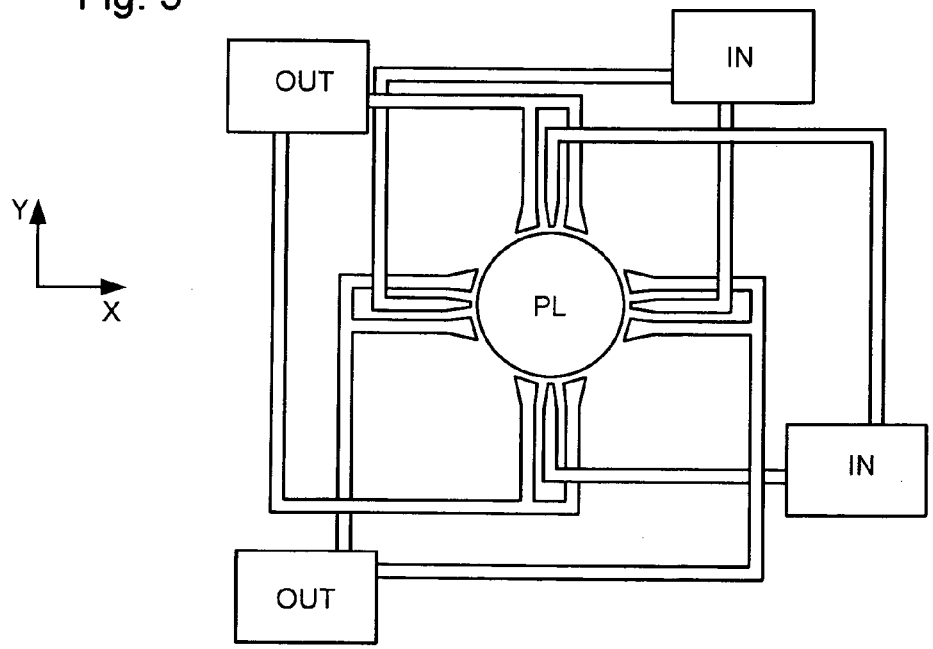

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
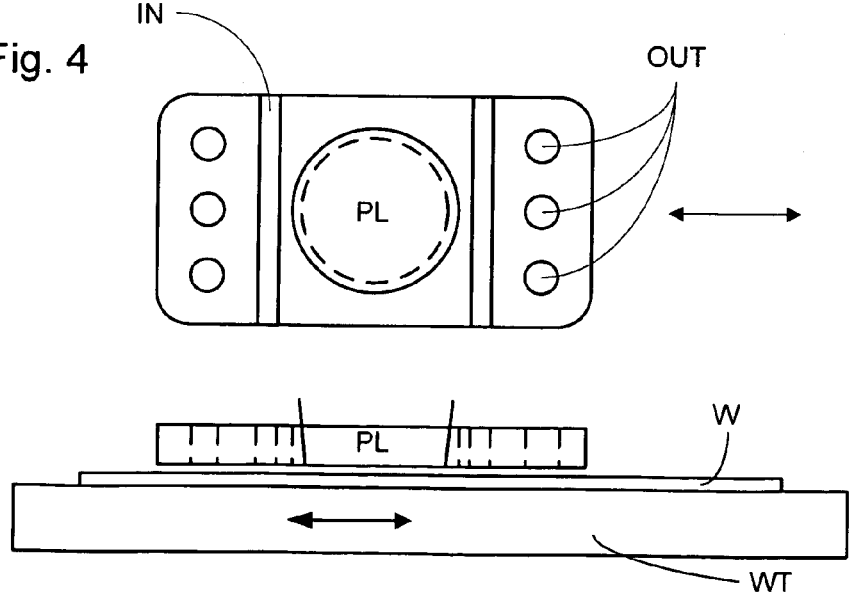
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
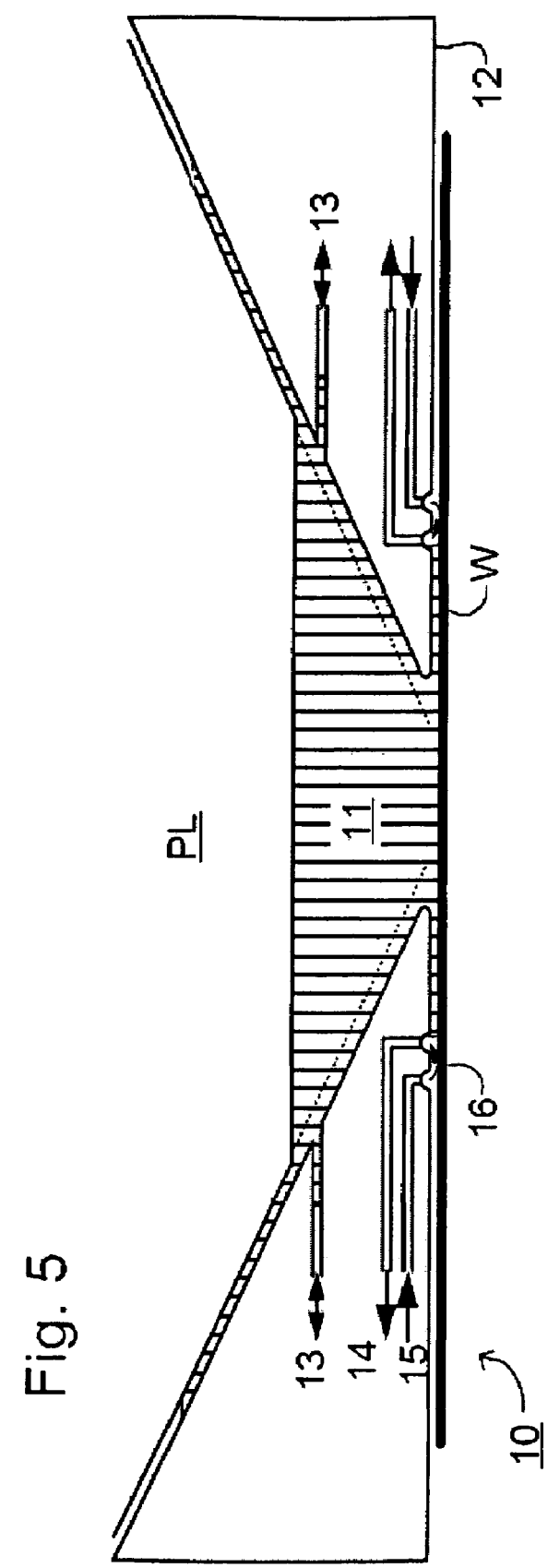
FIG. 5 depicts another liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). See, for example, U.S. patent application Ser. No. 10/844,575, hereby incorporated in its entirety by reference. A seal is formed between the liquid confinement structure and the surface of the substrate.

Referring to FIG. 5, reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in U.S. patent application Ser. No. 10/705,783, hereby incorporated in its entirety by reference.

In an embodiment, to facilitate imaging of the substrate, the leveling and alignment of the substrate may be performed at an exposure position of the substrate. In other words, a substrate level sensor (used to facilitate focus of a patterned projection beam on the substrate) and a substrate alignment sensor (used to facilitate proper lateral positioning of the substrate relative to the patterned projection beam) are provided around the projection system and/or the substrate positioned adjacent the projection system, so that the substrate can be measured when the substrate moves relative to and near the projection system during exposure. In an immersion lithography apparatus, with the structure used to provide or maintain liquid between the projection system and the substrate, the amount of physical space remaining to permit the provision or operation of one or both of those sensors is very limited. Such space may be even more at a premium with larger projection systems such as those having high numerical apertures (NA), such as about 1.3. Therefore, according to an embodiment, where the level sensor and/or the alignment sensor use a measuring radiation beam, the measuring radiation beam may wholly or partly pass through the projection system.

Figure 6:
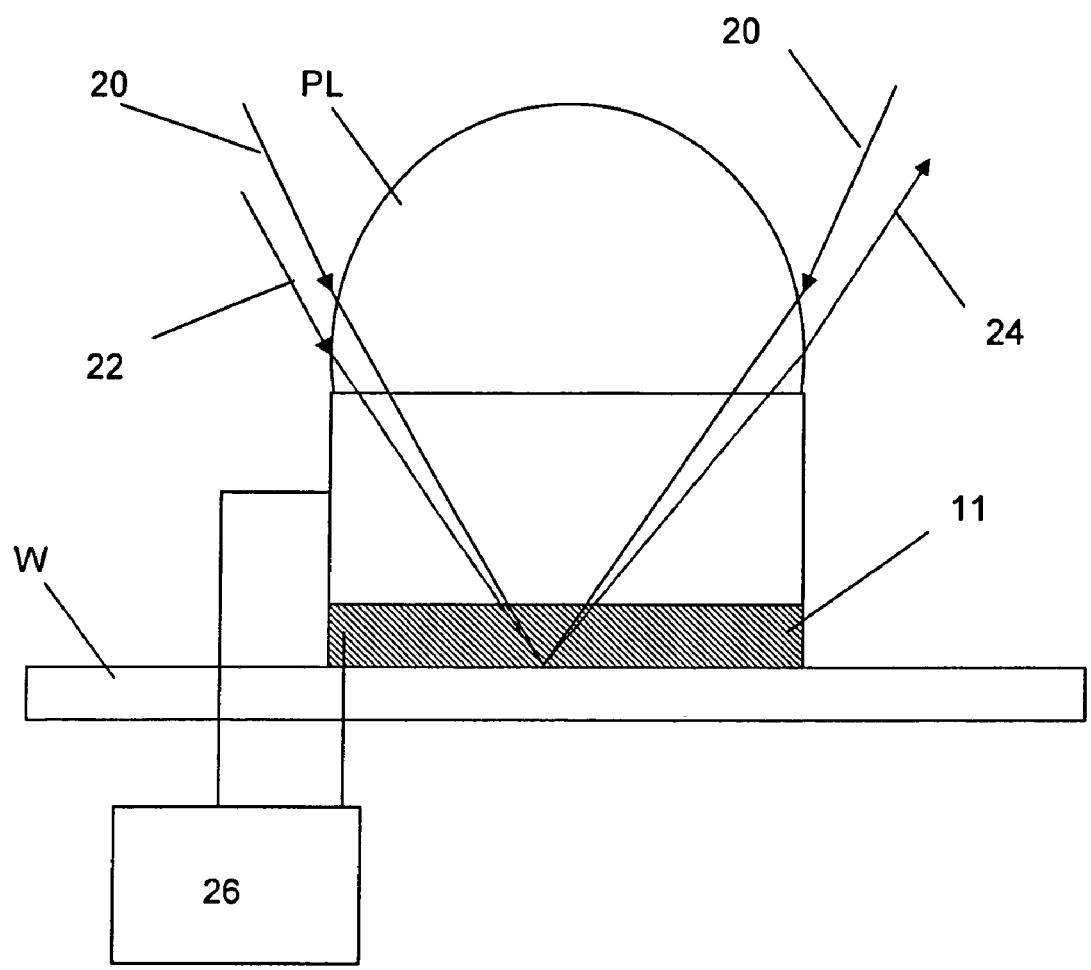
FIG. 6 schematically depicts passage of a radiation beam through an optical element of the projection system of a lithographic apparatus according to an embodiment of the invention.

FIG. 6 schematically depicts passage of a patterned projection beam and a measuring beam through an optical element of the projection system of an immersion lithographic apparatus according to an embodiment of the invention. A portion of an example projection system PL is shown. Liquid 11 is disposed between the projection system PL and the substrate W. A patterned projection beam 20 is shown as entering the portion of the projection system PL at two points (although as will be apparent, these are just 2 rays representative of a wave). The patterned projection beam 20 passes through the portion of the projection system PL, then through the liquid 11, and is focused onto the substrate W.

In this example, an incoming level sensor measuring beam 22 (e.g., provided by one or more laser sources, light emitting diodes, (halogen) lamps, etc.) is shown entering the portion of the projection system PL. The measuring beam passes through the portion of the projection system PL and then through the liquid 11 onto the substrate. The measuring beam reflects off the substrate W and then passes, as an outgoing level sensor measuring beam 24, through the liquid 11 and the portion of the projection system PL out to a level sensor detector (not shown). While a level sensor measuring beam is shown and described in FIG. 6, the measuring beam may instead or additionally be an alignment sensor measuring beam or any other measuring beam.

While the patterned projection beam 20 and the level sensor measuring beam 22,24 are shown as focused at substantially the same point on the substrate to facilitate accurate leveling/focus measurements, the beams need not be focused at the substantially same point. For example, the level sensor measuring beam 22,24 may be focused at a position in advance of where the patterned projection beam 20 will be focused so that leveling/focusing calculations and adjustments can be made in advance of the patterned beam projection beam 20 impinging the substrate W. Where the measuring beam 22, 24 is, for example, an alignment beam, the measuring beam 22, 24 may be focused at a different position, for example, at an alignment mark, than the patterned projection beam 20.

Since a measuring beam should not expose the radiation sensitive material of the substrate W, the wavelength of the radiation used for the measuring beam is selected not to expose the radiation sensitive material and thus is typically different than the wavelength of the radiation of the patterned projection beam. For example, in the case of a level sensor measuring beam, for rough capturing, HeNe laser radiation may be used for the measuring beam, but to reduce thin film effects, broad band radiation should be used instead or in addition.

However, in the case of level sensor, for example, using a different wavelength for the measuring beam than for the patterned projection beam, there will likely be a difference in the focus detected by the level sensor passing its measuring beam through the projection system from an actual focus associated with the patterned projection beam passing through the same projection system. This is because one or more projection system characteristics (such as refractive index) vary with wavelength. Thus, a change of refractive index somewhere in the optical path of the measuring beam (having a certain wavelength) may cause a detected focus to differ from an actual focus associated with the patterned projection beam (having a different wavelength). In addition or alternatively, other measurement results using a measuring beam, such as alignment, could similarly be affected. For example, in the case of an alignment beam, the actual lateral position of the patterned projection beam on the substrate may be different from the expected lateral position of the patterned beam as determined by an alignment measurement using an alignment measuring beam projected on an alignment mark on the substrate.

A change of the refractive index in the optical path of the measuring beam may occur in any number of ways. Examples include:

- temperature change of the liquid and/or the optical element through which the measuring beam passes;
- pressure change of the liquid and/or the optical element through which the measuring beam passes;
- composition change of the liquid (e.g., contamination); and
- pressure and/or temperature change in a flushing gas used to condition the measuring beam path into and/or out of the projection system.

Furthermore, a difference between a value measured using a measuring beam and an actual value associated with a patterned projection beam may also result from one or more other changes. For example, a change in the wavelength of the patterned projection beam may cause a measurement made using a measuring beam to be inaccurate. Similarly, a change in the wavelength of the measuring beam may cause a measurement made using that measuring beam to be inaccurate. Furthermore, movement (manipulation) of one or more optical elements in the projection system or substrate height movement may cause a difference between a value measured using a measuring beam and an actual value associated with a patterned projection beam.

Accordingly, in an embodiment, a metrology model/method is implemented to correct for the difference between an exposure parameter value measured using a measuring beam and an applied exposure parameter value associated with a patterned projection beam attributable to the difference in wavelength of the measuring beam and the projection beam.

Figure 7:
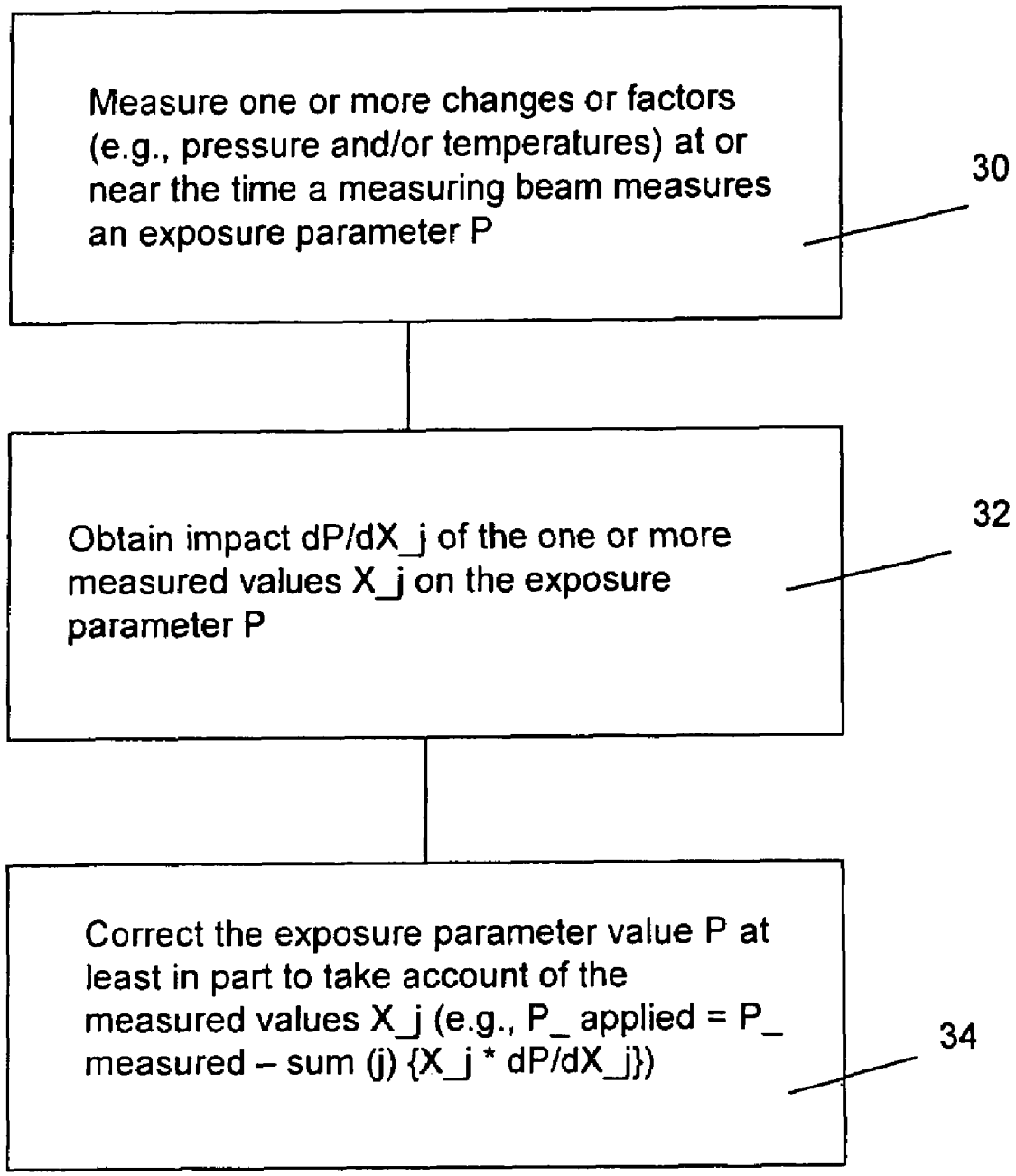
FIG. 7 depicts a flow chart of a method according to an embodiment of the invention.

FIG. 7 depicts a schematic flow chart of the metrology method according to an embodiment of the invention.

At step 30, one or more sensors 26 measure one or more of the physical property changes as described above at or near the time the measuring beam measures an exposure parameter P (such as focus, substrate height, and/or alignment). For example, a pressure sensor may measure the pressure of the liquid, flushing gas and/or optical element through which the measuring beam passes. Additionally or alternatively, a temperature sensor may measure the temperature of the liquid, flushing gas and/or optical element through which the measuring beam passes. In an embodiment, multiple different types of measurements may be made (e.g., pressure and temperature measurement) and/or multiple measurements of the same type may be made (e.g., multiple pressure measurements). The number of measurements are designated by the symbol j. The one or more measured physical property values may then be denominated as array $X\_j$. In an embodiment, one or more sensors provide a measured physical property value as a difference with respect to a nominal value, e.g., at which the lithographic apparatus was optimally adjusted. For example, a temperature sensor may provide the difference between the actual temperature measured (e.g., 22.3° C.) and a nominal temperature at which the lithographic apparatus was optimally adjusted. (e.g., 22.1° C.) as the temperature measurement (i.e., 0.2° C.). In an embodiment, it will be appreciated that the method may be extended to situations where a nominal value (i.e., calibration) has not been established through the use of additional calculations and/or measurements.

At step 32, the impact of the one or more measured physical property values $X\_j$ on the exposure parameter P is determined or obtained. This impact may be designated as the derivative $dP/dX\_j$. For example, where the exposure parameter P is focus and the measured physical property values $X\_j$ are temperature and pressure of the immersion liquid, $dP/dX\_j$ may represent the rate of change of focus with respect to temperature and pressure.

In an embodiment, $dP/dX\_j$ may be determined at, before or after step 32. In other words, $dP/dX\_j$ may be determined off-line, i.e., before the measuring beam measures the exposure parameter P, or on-line, i.e., at or near the time the measuring beam measures the exposure parameter P. In an embodiment, $dP/dX\_j$ may be determined by experiment/calibration, from empirical results, and/or by optical theory (e.g., optical ray tracing). For example, $dP/dX\_j$ may be calculated from the application of materials values (such as a table of values for a particular physical property at different conditions, e.g., the refractive index of a material at various temperatures) to relevant physics and/or mathematical formulas. In another example, $dP/dX\_j$ may be determined by experimental measurement. Furthermore, $dP/dX\_j$ may be determined for multiple exposure and/or measuring beam wavelengths and may be a difference between the value for the exposure beam wavelength and the measuring beam wavelength. Additionally or alternatively, $dP/dX\_j$ may be determined per projection system type (e.g., a projection system used in multiple lithographic apparatus) or individually per specific projection system in a lithographic apparatus.

At step 34, the measured exposure parameter P is corrected at least in part to take account of the measured physical property values $X\_j$. In an embodiment, this correction may be formulated as:

$$P\_applied = P\_measured - \text{sum}(j)\{X\_j * dP/dX\_j\}$$

where P_applied is the exposure parameter to be applied, for example, during exposure of the substrate by a patterned projection beam and P_measured is the exposure parameter as measured using the measuring beam. Thus, the term "sum (j) $(X\_j * dP/dX\_j)$" is the cumulative offset to be applied to the measured exposure parameter to obtain an exposure parameter to be applied, for example, during exposure of the substrate. The cumulative offset is the sum of the respective offsets attributable to each of the measured physical values $X\_j$. Matrix operations may be used for the correction so as to address possible cross terms between certain physical properties, such as projection system manipulator and environmental (e.g., temperature, pressure) dependencies. The determination and/or application of the exposure parameter to be applied may be performed continuously or at intermittent times.

So, in an example, a level sensor may project a measuring beam through an optical element of the projection system of a lithographic apparatus and through an immersion liquid to measure a height of the substrate F_measured during exposure of the substrate, the measured height corresponding to a focus for the patterned projection beam. This measured height (and thus focus) may then be corrected to take account of the temperature ($X\_1$) and pressure ($X\_2$) of the immersion liquid to yield a corrected height F_applied (and thus focus) to be applied during exposure of the substrate. A corrective function of the focus with respect to the temperature ($dF/dX\_1$) and pressure ($dF/dX\_2$) is provided (e.g., by experiment or empirical results). The corrective function is then multiplied with the measured values of the pressure and temperature and added together (sum(j) $\{X\_j * dF/dX\_j\}$) to yield a cumulative offset to be applied to the measured height to yield the corrected height (and thus corrected focus). This may be summarized by the formula F_applied=F_measured−sum(j) $\{X\_j * dF/dX\_j\}$.

In another example, an alignment sensor may project a measuring beam through an optical element of the projection system of a lithographic apparatus and through an immersion liquid to measure a X-Y position of the substrate LP_measured during exposure of the substrate, the measured X-Y position corresponding to a lateral placement of the patterned projection beam. This measured X-Y position (and thus lateral placement) may then be corrected to take account of the temperature ($X\_1$) and pressure ($X\_2$) of the immersion liquid to yield a corrected X-Y position LP_applied (and thus lateral placement) to be applied during exposure of the substrate. A corrective function of the lateral placement with respect to the temperature ($dLP/dX\_1$) and pressure ($dLP/dX\_2$) is provided (e.g., by experiment or empirical results). The corrective function is then multiplied with the measured values of the pressure and temperature and added together (sum(j)$\{X\_j * dLP/dX\_j\}$) to yield a cumulative offset to be applied to the measured X-Y position to yield the corrected X-Y position (and thus corrected lateral placement). This may be summarized by the formula LP_applied=LP_measured−sum(j)$\{X\_j * dLP/dX\_j\}$.

In an embodiment, the measured exposure parameter may be specifically corrected for the wavelength of the measuring beam and of the exposure beam to yield the exposure parameter to be applied. For example, this may be formulated as:

$$P\_applied = P\_measured - \Delta(MV) * (dP/dMV(\text{measuring beam wavelength}) - dP/dMV(\text{exposure wavelength}))$$

where P_applied is the exposure parameter, such as focus or lateral placement, to be applied, for example, during exposure of the substrate by a patterned projection beam, P_measured is the exposure parameter as measured using the measuring beam, Δ(MV) is the difference in the measured physical property value, such as temperature or pressure, from a nominal value (typically a value at which the lithographic apparatus was optimally configured), dP/dMV (measuring beam wavelength) is the rate of change of the exposure parameter with respect to the measured physical property value for the measuring beam wavelength, and dP/dMV(exposure wavelength) is the rate of change of the exposure parameter with respect to the measured physical property value for the measuring beam wavelength.

A lithographic apparatus may have various constants defined to provide good or optimal performance. For example, the lithographic apparatus may have one or more constants associated with the projection system such as positioning of one or more optical elements in the projection system and/or one or more constants associated with the alignment system such as alignment mark configuration and/or location. In embodiment, the metrology model may be implemented to correct for the wavelength dependency of these constants. In other words, one or measured physical property values, such as pressure and/or temperature, may be used in association with, for example, a rate of change of the constant relative to the measured value or a rate of change of a relevant exposure parameter relative to the measured value (e.g. dalignment/dtemperature or dfocus/dpressure) to yield a corrected constant.

To implement the method described above, a correction system may be provided to a lithographic apparatus which is configured or programmed to perform an embodiment of the method as described herein. The correction system may be a computer program incorporated into a processor or sensor of the lithographic apparatus. Further, a computer program product (e.g., a software program on a disk or in a memory) may be provided to perform an embodiment of the method as described herein.

In an embodiment, the last optical element of the projection system is stiff mounted to the rigid body of the remainder of the projection system (e.g., lens body). Due to static forces (immersion liquid height and/or over pressure difference of the projection system) and dynamic forces (immersion liquid flow and/or dynamic environmental pressure change), the last optical element may change in height. In an immersion lithography system, this may lead to a change of the optical path which, between alignment measurements, may lead to mainly focus and/or spherical aberration drift. For a projection system NA of 0.75, 193 nm radiation and water as the immersion liquid, the sensitivity may be ~1 nm defocus and 9 pm Z9 drift per nm Z-displacement. With a stiffness of $5 \times 10^6$ and a maximum allowable Z9 drift of 0.5 nm, this could lead to a maximum force of 0.3N on the optical element connected to the liquid—a force that may occur in an immersion lithographic apparatus.

Thus, in an embodiment, a sensor may be provided to measure a height of an optical element configured to be connected to the liquid (e.g., the last optical element of the projection system). In an embodiment, the sensor may be implemented as part of an existing level sensor provided to measure a height (e.g. with respect to the last optical element of the projection system) of the substrate or of another object such as the substrate table, including any sensor, fiducial, etc. In an embodiment, the sensor may be a separate sensor, from the level sensor, for this purpose.

Figure 8:
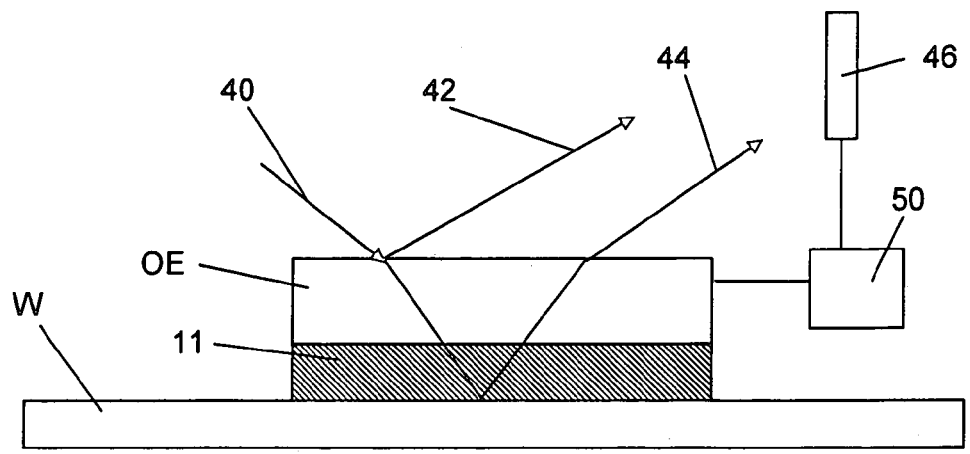
FIG. 8 schematically depicts a sensor used to measure a height or change of height of an optical element of the projection system of a lithographic apparatus according to an embodiment of the invention.

In an embodiment, the sensor to measure a height of the optical element is an optical sensor configured to detect a measuring beam traveling from the optical element to measure the height of the optical element and optionally to project the measuring beam at the optical element. Referring to FIG. 8, an arrangement for the optical sensor 46 is schematically depicted. An incoming measuring beam 40 (e.g., provided by one or more laser sources, light emitting diodes, (halogen) lamps, etc.) is shown directed at the optical element OE, which optical element is connected to the liquid 11. The measuring beam reflects off a top surface of the optical element OE, as an outgoing measuring beam 42, to the sensor detector 46, which is used to determine the height of the optical element. In an embodiment, the measuring beam is a level sensor measuring beam although it may instead or additionally be an alignment sensor measuring beam or any other measuring beam. In an embodiment, the measuring beam may be reflected off a bottom surface of the optical element OE (e.g., the surface that is the interface between the optical element OE and the liquid 11). When reflected off the bottom surface, the beam may pass through the top surface of the optical element OE to the bottom surface, where the beam is reflected toward and out the top surface. Alternatively, the beam may be projected directly onto the bottom surface by, e.g., a beam emanating or reflected from below the optical element OE.

In an embodiment, the sensor may be configured as part of a level sensor 46 used to measure the height of the substrate (or other object). An incoming level sensor measuring beam 40 (e.g., provided by one or more laser sources, light emitting diodes, (halogen) lamps, etc.) is shown entering the optical element OE. The measuring beam passes through the optical element OE and then through the liquid 11 onto the substrate (or other object). The measuring beam reflects off the substrate (or other object) and then passes, as an outgoing level sensor measuring beam 44, through the liquid 11 and the optical element OE out to a level sensor detector 46. A portion of the incoming level sensor measuring beam 40 reflects off a top surface of the optical element OE, as an outgoing measuring beam 44, to the sensor detector 46. Alternatively, the incoming measuring beam used to create the outgoing measuring beam 44 could be directed at a different angle or have a different wavelength in order to cause it to reflect off the optical element OE. The outgoing level sensor measuring beam 42 and the outgoing measuring beam 44 created an interference area. By analyzing the fringes of the interference area, the difference in height in between the substrate (or the object) and the optical element can be detected or determined and thus the change in height of the optical element can be determined.

Figure 9:
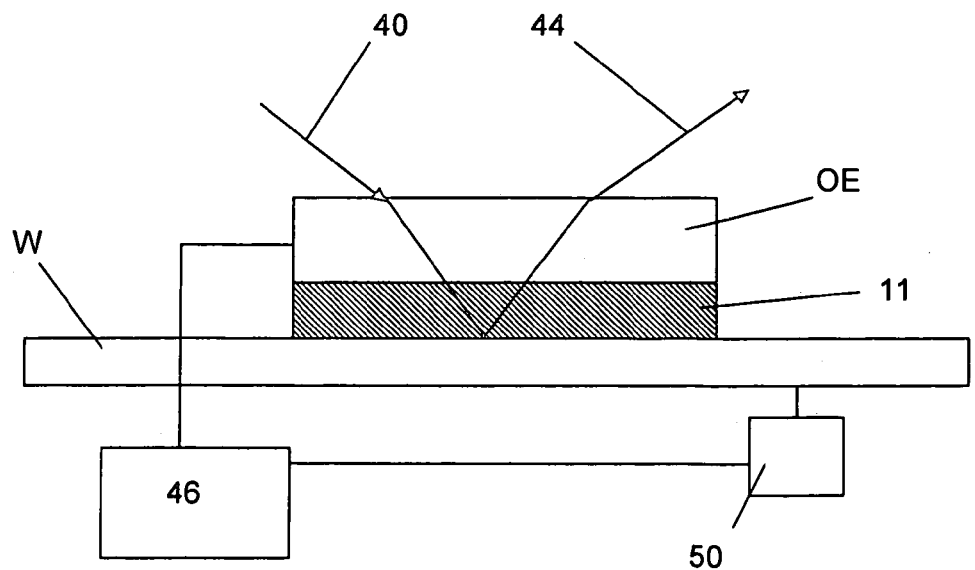
FIG. 9 schematically depicts a sensor used to measure a height or change of height of an optical element of the projection system of a lithographic apparatus according to an embodiment of the invention.

In an alternative or additional embodiment, the sensor may be a mechanical, ultrasonic, magnetic and/or electrical sensor to measure the height or change in height of the optical element. Referring to FIG. 9, sensor 46 is a mechanical, ultrasonic, magnetic and/or electrical sensor used to measure a height of the optical element OE.

In each case, the measured height from the sensor may be used to at least partly correct for a change in the measured height of the optical element. In an embodiment, a signal may be sent from the sensor 46 to a servo system 50 which controls a positioning system PW of the substrate table WT so that the height of substrate (or other object) can be adjusted to at least partly correct for the change in measured height of the optical element. Additionally or alternatively, a signal may be sent to a servo system 50 used to control the position of the optical element height so that the height of the optical element can be adjusted to at least partly correct for the change in measured height of the optical element.

Through this mechanism, focus and spherical aberration caused by changing forces on the optical element of the projection system connected to the liquid may be stabilized and/or reduced.

For further clarity, the term height includes change in height and may include tilt. Additionally, while the concepts herein have been described in the context of a lithography apparatus, they might equally be applied to other apparatus that use a liquid between an optical element and surface of an object. For example, the concepts herein may be applied to an immersion metrology apparatus that uses a beam of radiation projected through a liquid to measure characteristics of an object.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table. In a preferred embodiment, the apparatus, method and/or computer program product as described herein is applied to a single stage/table lithography apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, an embodiment of the invention may take the form of a computer program containing one or more sequences of machine-readable instructions describing a method as disclosed above, or a data storage medium (e.g. semiconductor memory, magnetic or optical disk) having such a computer program stored therein. For example, the metrology model/method may be implemented as a computer program and the computer program may interact with the lithographic apparatus to obtain measured data (e.g., obtain a measured focus from one or more level sensors of the lithographic apparatus and/or obtain a measured lateral placement from one or more alignment sensors of the lithographic apparatus) and return corrected data (e.g., return the measured focus as corrected to account for the different wavelength of the level sensor(s) measuring beam and/or return the measured lateral placement as corrected to account for the different wavelength of the alignment sensor(s) measuring beam).

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

More generally, each step of the method may be executed on any general computer, such as a mainframe computer, personal computer or the like and pursuant to one or more, or a part of one or more, program modules or objects generated from any programming language, such as C++, Java, Fortran or the like. And still further, each step, or a file or object or the like implementing each step, may be executed by special purpose hardware or a circuit module designed for that purpose. For example, the invention may be implemented as a firmware program loaded into non-volatile storage or a software program loaded from or into a data storage medium as machine-readable code, such code being instructions executable by an array of logic elements such as a microprocessor or other digital signal processing unit.

The invention may be implemented as an article of manufacture comprising a computer usable medium having computer readable program code means therein for executing the method steps of the invention, a program storage device readable by a machine, tangibly embodying a program of instructions executable by a machine to perform the method steps of the invention, a computer program product, or an article of manufacture comprising a computer usable medium having computer readable program code means therein, the computer readable program code means in said computer program product comprising computer readable code means for causing a computer to execute the steps of the invention. Such an article of manufacture, program storage device, or computer program product may include, but is not limited to, CD-ROMs, diskettes, tapes, hard drives, computer system memory (e.g. RAM or ROM) and/or the electronic, magnetic, optical, biological or other similar embodiment of the program (including, but not limited to, a carrier wave modulated, or otherwise manipulated, to convey instructions that can be read, demodulated/decoded and executed by a computer). Indeed, the article of manufacture, program storage device or computer program product may include any solid or fluid transmission medium, magnetic or optical, or the like, for storing or transmitting signals readable by a machine for controlling the operation of a general or special purpose computer according to the method of the invention and/or to structure its components in accordance with a system of the invention.

The invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another apparatus (such as a lithographic apparatus).

The system may be specially constructed for the required purposes to perform, for example, the method steps of the invention or it may comprise one or more general purpose computers as selectively activated or reconfigured by a computer program in accordance with the teachings herein stored in the computer(s). The system could also be implemented in whole or in part as a hard-wired circuit or as a circuit configuration fabricated into an application-specific integrated circuit. The invention presented herein is not inherently related to a particular computer system or other apparatus. The required structure for a variety of these systems will appear from the description given.

In the case of diagrams depicted herein, they are provided by way of example. There may be variations to these diagrams or the steps (or operations) described herein without departing from the spirit of the invention. For instance, in certain cases, the steps may be performed in differing order, or steps may be added, deleted or modified. All of these variations are considered to comprise part of the invention as recited in the appended claims.

The descriptions above are intended to be illustrative, not limiting. Thus, it will be apparent to one skilled in the art that modifications may be made to the invention as described without departing from the scope of the claims set out below.

The invention claimed is:

1. A method for correcting an exposure parameter of an immersion lithographic apparatus, the method comprising:
    measuring an exposure parameter using a measuring beam projected through a liquid between the projection system and a table of the immersion lithographic apparatus; and
    determining an offset based on a change of a physical property impacting a measurement made using the measuring beam to at least partly correct the measured exposure parameter,
    wherein the exposure parameter comprises a lateral placement of a patterned beam to be projected using the projection system, an X-Y position of a substrate held on the table, or both.

2. The method according to claim 1, wherein the physical property comprises (a) a temperature, or (b) a pressure, or (c) a composition, or (d) any combination of (a)-(c), of the liquid.

3. The method according to claim 1, wherein the physical property comprises (a) a temperature, or (b) a pressure, or (c) a composition, or (d) any combination of (a)-(c), of a flushing gas, of or on an optical element of the projection system, or both.

4. The method according to claim 1, wherein the exposure parameter comprises a focus of a patterned beam to be projected using the projection system, a height of the substrate held on the table, or both.

5. The method according to claim 1, wherein the physical property comprises a wavelength of the measuring beam, a wavelength of a patterned beam to be projected using the projection system, or both.

6. The method according to claim 1, comprising projecting the measuring beam and a patterned beam for the exposure of the substrate through an optical element of the projection system.

7. The method according to claim 1, wherein determining the offset based on the change of the physical property comprises determining the offset based on the difference between the change of the physical property for a wavelength of the measuring beam and a change of the physical property for a wavelength of a patterned beam to be projected using the projection system.

8. A method for correcting an exposure parameter of an immersion lithographic apparatus, the method comprising:
    measuring an exposure parameter using a measuring beam projected through a liquid between the projection system and a table of the immersion lithographic apparatus; and
    determining an offset based on a change of a physical property impacting a measurement made using the measuring beam to at least partly correct the measured exposure parameter,
    wherein the offset comprises a multiplication of the change of the physical property and a rate of change of the exposure parameter with respect to the physical property.

9. A computer program product for correcting an exposure parameter of an immersion lithographic apparatus, comprising:
    software code configured to measure an exposure parameter using a measuring beam projected through a liquid between the projection system and a table of the immersion lithographic apparatus; and
    software code configured to determine an offset based on a change of a physical property impacting a measurement made using the measuring beam to at least partly correct the measured exposure parameter,
    wherein the exposure parameter comprises a lateral placement of a patterned beam to be projected using the projection system, an X-Y position of a substrate held on the table, or both.

10. The computer program product according to claim 9, wherein the physical property comprises (a) a temperature, or (b) a pressure, or (c) a composition, or (d) any combination of (a)-(c), of the liquid.

11. The computer program product according to claim 9, wherein the physical property comprises (a) a temperature, or (b) a pressure, or (c) a composition, or (d) any combination of (a)-(c), of a flushing gas, of or on an optical element of the projection system, or both.

12. The computer program product according to claim 9, wherein the exposure parameter comprises a focus of a patterned beam to be projected using the projection system, a height of a substrate held on the table, or both.

13. The computer program product according to claim 9, wherein the physical property comprises a wavelength of the measuring beam, a wavelength of a patterned beam to be projected using the projection system, or both.

14. The computer program product according to claim 9, comprising software code configured to determine the offset based on the difference between a change of the physical property for a wavelength of the measuring beam and a change of the physical property for a wavelength of a patterned beam to be projected using the projection system.

15. A computer program product for correcting an exposure parameter of an immersion lithographic apparatus, comprising:
- software code configured to measure an exposure parameter using a measuring beam projected through a liquid between the projection system and a table of the immersion lithographic apparatus;
- software code configured to determine an offset based on a change of a physical property impacting a measurement made using the measuring beam to at least partly correct the measured exposure parameter; and
- software code configured to determine the offset by multiplication of the change of the physical property and a rate of change of the exposure parameter with respect to the physical property.

16. A method of correcting for an imaging error of an immersion lithographic apparatus, comprising:
- measuring a height of an optical element of a projection system in the immersion lithographic apparatus, the optical element connected to a liquid between the projection system and a table of the projection system; and
- at least partly correcting the image error by moving the optical element, moving the table, or both,
- wherein measuring the height comprises detecting a measuring beam that reflects from the optical element and evaluating fringes created by interference between the measuring beam and a beam reflected from the table or a substrate held on the table.

17. The method according to claim 16, wherein the imaging error is a focus error, a spherical aberration, or both.

18. The method according to claim 16, wherein measuring the height comprises projecting a measuring beam at the optical element and detecting a measuring beam traveling from the optical element.

19. The method according to claim 16, wherein measuring the height is performed using a level sensor configured to measure a height of the table or a substrate held on the table.

* * * * *

UNITED STATES PATENT AND TRADEMARK OFFICE
CERTIFICATE OF CORRECTION

PATENT NO. : 7,670,730 B2 Page 1 of 1
APPLICATION NO. : 11/298942
DATED : March 2, 2010
INVENTOR(S) : Bob Streefkerk et al.

It is certified that error appears in the above-identified patent and that said Letters Patent is hereby corrected as shown below:

On title page, item (75) Inventors
replace "Jeroen Johannes Sophia Mertens"
with --Jeroen Johannes Sophia Maria Mertens--.

Signed and Sealed this

Twentieth Day of April, 2010

David J. Kappos
*Director of the United States Patent and Trademark Office*